(12) United States Patent
Cho et al.

(10) Patent No.: US 9,130,452 B2
(45) Date of Patent: *Sep. 8, 2015

(54) GATE DRIVING DEVICE INCLUDING PLURALITY OF GATE DRIVERS SUPPLIED WITH EQUALLY DIVIDED VOLTAGE AND INVERTER HAVING THE SAME

(71) Applicant: SAMSUNG ELECTRO-MECHANICS CO., LTD., Suwon, Gyunggi-do (KR)

(72) Inventors: Won Jin Cho, Gyunggi-do (KR); Dong Hwan Kim, Gyunggi-do (KR); Min Hyuk Jung, Gyunggi-do (KR); Bum Seok Suh, Gyunggi-do (KR); Ji Yeon Oh, Gyunggi-do (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 80 days.

This patent is subject to a terminal disclaimer.

(21) Appl. No.: 13/909,896

(22) Filed: Jun. 4, 2013

(65) Prior Publication Data

US 2014/0286066 A1 Sep. 25, 2014

(30) Foreign Application Priority Data

Mar. 20, 2013 (KR) ........................ 10-2013-0029996

(51) Int. Cl.
*H03K 17/06* (2006.01)
*H02M 1/08* (2006.01)
*H02M 7/5387* (2007.01)

(52) U.S. Cl.
CPC ............ *H02M 1/08* (2013.01); *H02M 7/53871* (2013.01); *H03K 2217/0081* (2013.01)

(58) Field of Classification Search
CPC ..... H03K 17/063; H02P 27/06; H02M 7/538; H02M 2007/4811

USPC ........ 327/108–112; 363/131, 95, 97, 98, 132; 323/313–317
See application file for complete search history.

(56) References Cited

U.S. PATENT DOCUMENTS

| 4,099,115 | A | * | 7/1978 | Watanabe ..................... 323/314 |
| 5,796,296 | A | * | 8/1998 | Krzentz ......................... 327/545 |
| 2003/0112040 | A1 | | 6/2003 | Yoshimura |
| 2004/0120170 | A1 | * | 6/2004 | Scott ................................ 363/97 |
| 2005/0116744 | A1 | | 6/2005 | Iwagami et al. |
| 2014/0084693 | A1 | * | 3/2014 | Jeong et al. ..................... 307/77 |

FOREIGN PATENT DOCUMENTS

| JP | 3806644 B2 | 8/2006 |
| KR | 2005-0052339 A | 6/2005 |
| KR | 2007-0088869 A | 8/2007 |

OTHER PUBLICATIONS

Korean Office Action issued in Korean Application No. 10-2013-0029996 dated Apr. 10, 2014, w/English translation.

* cited by examiner

*Primary Examiner* — Harry Behm
*Assistant Examiner* — Peter Novak
(74) *Attorney, Agent, or Firm* — McDermott Will & Emery LLP

(57) ABSTRACT

There is provided a gate driving device, including: an inverter arm including a high-side switch and a low-side switch; a gate driving unit receiving an instruction signal to provide switching control to the inverter arm, outputting a control signal to control switching of the inverter arm, and including a plurality of gate drivers; and a balancing unit causing voltage applied to the plurality of gate drivers to be divided to be supplied to respective gate drivers among the plurality of gate drivers, according to the switching of the inverter arm based on the control signal.

13 Claims, 9 Drawing Sheets

GATE DRIVING DEVICE INCLUDING PLURALITY OF GATE DRIVERS SUPPLIED WITH EQUALLY DIVIDED VOLTAGE AND INVERTER HAVING THE SAME

CROSS-REFERENCE TO RELATED APPLICATIONS

This application claims the priority of Korean Patent Application No. 10-2013-0029996 filed on Mar. 20, 2013, in the Korean Intellectual Property Office, the disclosure of which is incorporated herein by reference.

BACKGROUND OF THE INVENTION

1. Field of the Invention

The present invention relates to a gate driving device driven at high voltage and an inverter having the same.

2. Description of the Related Art

In general, an inverter is a type of electrical circuit able to change direct current (DC) power into alternating current (AC) power, and is capable of controlling voltage amplitude, frequency, and the like of the AC power, thereby outputting AC power for driving a motor, for example.

Such an inverter has a wide range of domestic, commercial and industrial applications.

A driving device may drive such an inverter. The driving device drives the inverter by turning a switch of an arm for supplying AC power in the inverter on and off so as to supply the AC power.

For industrial applications of the inverter, high voltage AC power may be required, depending on industrial requirements.

A typical inverter may employ gate driving integrated circuits, each of which turns a high-side switch and a low-side switch of an inverter arm, on and off, respectively. Here, since high voltage may be applied to the high-side switch, the gate driving integrated circuit turning the high-side switch on and off is required to have withstand voltage characteristics in order to withstand high levels of voltage applied to the high-side switch.

In an inverter for industrial use, a voltage of 1200 V or above may be applied to the high-side switch, and thus, the gate driving integrated circuit controlling the high-side switch is required to have withstand voltage characteristics of 1200V or above. However, such a gate driving integrated circuit having high withstand voltage characteristics may be relatively expensive to manufacture.

Patent Document 1, referenced below, discloses an inverter circuit including a high-voltage driving circuit, but is silent on dividing the withstand voltage of the driving device.

RELATED ART DOCUMENT (Patent Document 1) Korean Patent Laid-open Publication No. 2005-0052339

SUMMARY OF THE INVENTION

An aspect of the present invention provides a gate driving device stably operable at high voltage, and an inverter having the same.

An aspect of the present invention also provides a gate driving device capable of preventing voltage having a level above that of withstand voltage from being applied in a transient state, and an inverter having the same.

According to an aspect of the present invention, there is provided a gate driving device, including: an inverter arm including a high-side switch and a low-side switch; a gate driving unit receiving an instruction signal to provide switching control to the inverter arm, outputting a control signal to control switching of the inverter arm, and including a plurality of gate drivers; and a balancing unit causing voltage applied to the plurality of gate drivers to be divided to be supplied to respective gate drivers among the plurality of gate drivers, according to the switching of the inverter arm based on the control signal.

The balancing unit may include a plurality of balancers connected to the plurality of gate drivers, respectively, and causing the voltage applied to the plurality of gate drivers to be equally divided to be supplied to the respective gate drivers.

The plurality of balancers may include a plurality of resistors respectively connected to the plurality of gate drivers in parallel.

The plurality of balancers may include a plurality of capacitors respectively connected to the plurality of resistors in parallel.

The balancing unit may maintain a state of voltage divided to be supplied to the respective gate drivers when a level of a signal output from any one of the plurality of gate drivers is changed from high to low.

The gate driving device may further include a driving power supply unit supplying driving power to the gate driving unit.

The gate driving device may further include a power supply unit delivering the driving power to the plurality of gate drivers.

The power supply unit may include a plurality of diodes connected to one another in series.

The power supply unit may include a plurality of diodes connected to one another in parallel.

According to another aspect of the present invention, there is provided an inverter including: an inverter unit having an inverter arm and switching input power to output alternating current (AC) power, the inverter arm including a high-side switch and a low-side switch connected to each other in series between an input power terminal supplying the input power having a predetermined voltage level and a ground; a gate driving unit having a plurality of gate drivers to control switching of the high-side switch, the gate drivers being disposed between an input terminal receiving an instruction signal to provide switching control to the inverter unit and an output terminal outputting a control signal to control switching of the inverter unit; and a balancing unit causing voltage applied to the plurality of gate drivers to be divided to be supplied to respective gate drivers among the plurality of gate drivers according to the switching of the high-side switch, and maintaining a state of voltage divided to be supplied to the respective gate drivers.

The balancing unit may include a plurality of balancers connected to the plurality of gate drivers, respectively, and causing the voltage applied to the plurality of gate drivers to be equally divided to be supplied to the respective gate drivers.

The plurality of balancers may include a plurality of resistors respectively connected to the plurality of gate drivers in parallel.

The plurality of balancers may include a plurality of capacitors respectively connected to the plurality of resistors in parallel.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
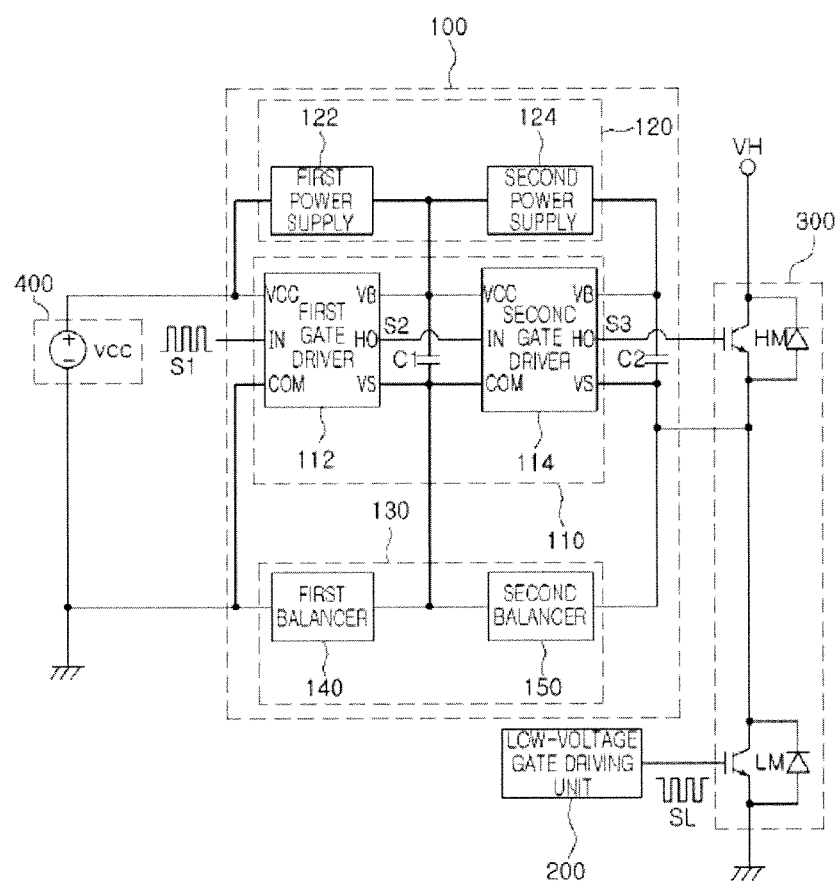
FIG. 1 is a view showing a gate driving device according to an embodiment of the present invention.

Hereinafter, embodiments of the present invention will be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

Throughout the drawings, the same or like reference numerals will be used to designate the same or like elements.

FIG. 1 is a view showing agate driving device according to an embodiment of the present invention.

Referring to FIG. 1, the gate driving device may include a high-voltage gate driving unit 100, a low-voltage gate driving unit 200, and an inverter unit 300.

The high-voltage gate driving unit 100 may receive an instruction signal S1 to provide switching control to the inverter unit 300, and output a control signal S3 to control switching of the inverter unit 300.

The high-voltage gate driving unit 100 may include a gate driving unit 110, a power supply unit 120, and a balancing unit 130.

The gate driving unit 110 may be disposed between an instruction signal input terminal receiving the instruction signal S1 to provide switching control to the inverter unit 300 and a control signal output terminal outputting the control signal S3 to control switching of the inverter unit 300.

Further, the gate driving unit 110 may include a plurality of gate drivers. For example, as shown in FIG. 1, the gate driving unit 110 may include a first gate driver 112 and a second gate driver 114.

The gate driving unit 110 may control the switching of the inverter unit 300.

Upon receiving the instruction signal S1, the first gate driver 112 may transmit (S2) the information on the switching control included in the instruction signal S1 to the second gate driver 114.

The second gate driver 114 may deliver the control signal S3 corresponding to the instruction signal S1 input to the first gate driver 112 to the inverter unit 300, thereby controlling the switching of the inverter unit 300.

The inverter unit 300 may switch input power VH to output alternating current (AC) power. Further, the inverter unit 300 may include an inverter arm having a high-side switch HM and a low-side switch LM connected in series between an input terminal through which the input power VH is input, and a ground.

Although not shown, a plurality of high-side switches HM may be connected in series in order to divide voltage applied thereto. Likewise, a plurality of low-side switches LM may be connected in series.

The control signal S3 from the high-voltage gate driving unit 100 may be input to a gate of the high-side switch HM so as to control switching on and off. In addition, a control signal SL from the low-voltage gate driving unit 200 may be input to a gate of the low-side switch LM so as to control switching on and off.

A voltage level corresponding to input power VH may be applied to the high-voltage gate driving unit 100 according to the switching on and off of the high-side switch HM.

The high-voltage gate driving unit 100 may include the balancing unit 130 so that the voltage level of the applied power may be divided to be supplied to the first gate driver 112 and the second gate driver 114. That is, the balancing unit 130 may cause the voltage applied to the gate driving unit to be divided to be supplied to the first gate driver 112 and the second gate driver 114, according to the switching of the inverter arm.

The balancing unit 130 may include a plurality of balancers. The plurality of balancers may be connected to the plurality of gate drivers, respectively, so as to cause the voltage applied to the gate drivers to be equally divided.

Referring to FIG. 1, the balancing unit 130 may include a first balancer 140 and a second balancer 150. The first balancer 140 may be connected to the first gate driver 112 in parallel. Likewise, the second balancer 150 may be connected to the second gate driver 114 in parallel.

Accordingly, the first balancer 140 and the second balancer 150 may cause the voltage of the power applicable to the first gate driver 112 and the second gate driver 114 to be equally divided, according to the switching on and off of the high-side switch HM.

For example, if input power VH having a voltage level of 1200 V or above is input, the voltage level applied to the high-voltage gate driving unit 100 may be equally divided to be supplied to the first gate driver 112 and the second gate driver 114, according to the switching on and off of the high-side switch HM. In this case, a gate driver having a withstand voltage of 600V may be used for each of the first gate driver 112 and the second gate driver 114.

Further, the gate driving device may include a driving power supply unit 400 supplying driving power to the gate driving unit 110.

In order to apply a single power vcc to the plurality of gate drivers 112 and 114, the high-voltage gate driving unit 100 may include the power supply unit 120.

The power supply unit 120 may include a plurality of power suppliers 122 and 124, and the power suppliers 122 and 124 may supply the single power vcc to terminals of the gate driving drivers 112 and 114.

According to an embodiment of the invention, when an "on" signal is applied to the low-side switch LM and an "off" signal is applied to the high-side switch HM, a first capacitor C1 and a second capacitor C2 are charged with the power vcc by the driving power supply unit 400 and the power supply unit 120.

Then, when an "off" signal is applied to the low-side switch LM and an "on" signal is applied to the high side switch HM, the voltage level corresponding to input power VH may be applied to the high-voltage gate driving unit 100.

The applied voltage may be applied to a terminal VS of the second gate driver 114. Further, a voltage of a terminal VB of the second gate driver 114 may be determined by the voltage applied to the terminal VS and a voltage in the second capacitor C2. For example, the voltage of the terminal VB of the second gate driver 114 may be the sum of the voltage applied to the terminal VS of the second gate driver 114 and the voltage charged in the second capacitor C2.

When the applied voltage is equally divided by the first balancer 140 and the second balancer 150, the divided voltage may be applied to a terminal VS of the first gate driver 112. Further, a voltage of a terminal VB of the first gate driver 112 may be determined by the voltage applied to the terminal VS of the first gate driver 112 and a voltage in the first capacitor C1. For example, the voltage of the terminal VB of the first gate driver 112 may be the sum of the voltage applied to the terminal VS of the first gate driver 112 and the voltage charged in the first capacitor C1.

Accordingly, a range of voltage on an output terminal HO of the control signal S3 for driving the high-side switch HM may be determined by the voltage applied to the terminal VS of the second gate driver 114 and a voltage applied to a terminal VCC of the second gate driver 114.

Further, a range of voltage on an output terminal HO of the first gate driver 112 may be determined by the voltage applied to the terminal VS of the first gate driver 112 and a voltage applied to a terminal VCC of the first gate driver 112.

That is, according to the embodiment of the invention, the voltage on the output terminal HO of the second gate driver 114 may range from the voltage level (e.g., VH) applied to the terminal VS of the second gate driver 114 to the voltage level (e.g., VH+VCC) applied to the terminal VB of the second gate driver 114.

Further, the voltage applied to the output terminal HO of the first gate driver 112 may range from the voltage level (e.g., 0.5×VH) applied to the terminal VS of the first gate driver 112 to the voltage level (e.g., 0.5×VH+VCC) applied to the terminal VB of the second gate driver.

Further, a voltage applied to an input terminal IN of the first gate driver 112 may range from a voltage level (e.g., 0 V) applied to a terminal COM of the first gate driver 112 to the voltage level (e.g., VCC) applied to the terminal VCC of the first gate driver 112.

The low-voltage gate driving unit 200 may control the switching of the low-side switch LM.

Figure 2:
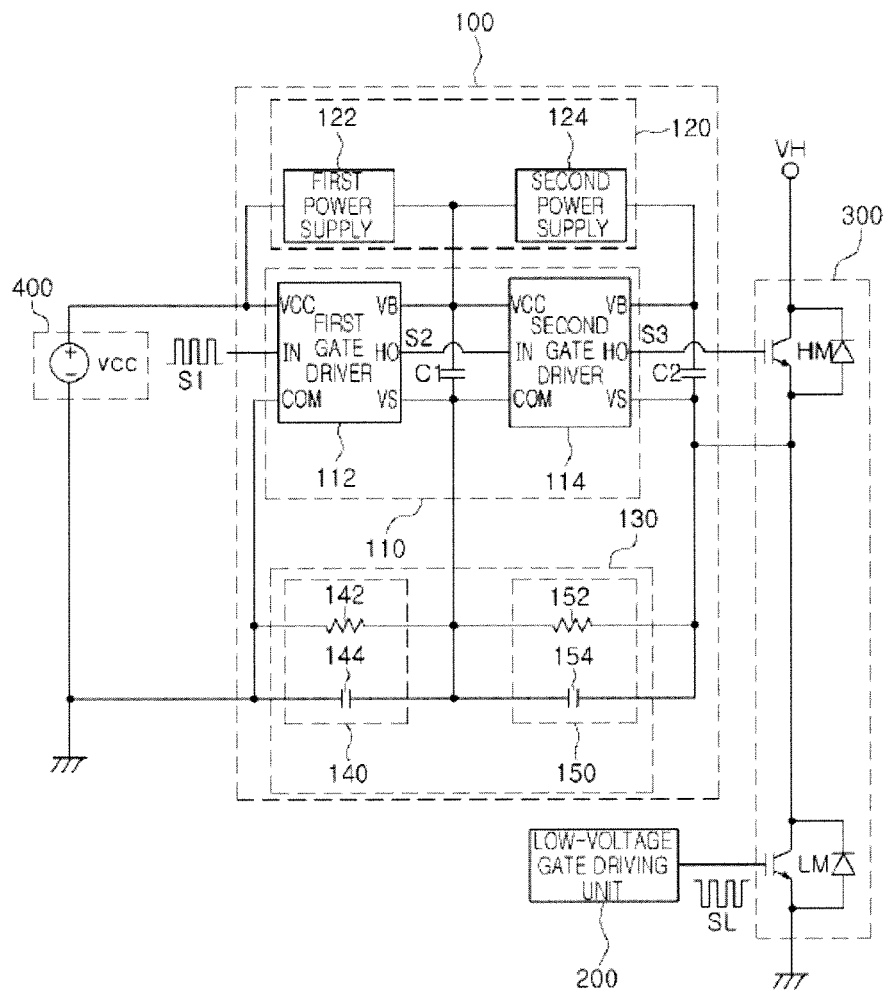
FIG. 2 is a view showing a balancing unit in a gate driving device according to an embodiment of the present invention.

FIG. 2 is a view showing a balancing unit in a gate driving device according to an embodiment of the present invention.

Referring to FIG. 2, the balancing unit may include the first balancer 140 for the first gate driver 112, and the second balancer 150 for the second gate driver 114.

Since components other than the balancing unit are the same as those described above, detailed descriptions thereof will be omitted.

The first balancer 140 may include a first resistor 142 and a first capacitor 144. The first resistor 142 may be connected to the first gate driver 112 in parallel. Further, the first capacitor 144 may be connected to the first resistor 142 in parallel.

The second balancer 150 may include a second resistor 152 and a second capacitor 154. Here, the second resistor 152 may be connected to the second gate driver 114 in parallel. Further, the second capacitor 154 may be connected to the second resistor 152 in parallel.

Referring to FIG. 2, in a case in which the resistance of the first resistor 152 and the resistance of the second resistor 152 are of the same value, the voltage may be equally divided to be supplied to the first gate driver 112 and the second gate driver 114.

The first capacitor 144 and the second capacitor 154 may prevent the voltage from being unequally divided to be supplied to the first gate driver 112 and the second gate driver 114 in a transient state. Here, the transient state may refer to a state during which a level of an output signal S2 or S3 of the first gate driver 112 or the second gate driver 114 is changed from high to low.

That is, the balancing unit 130 may maintain the state of the voltage divided to the plurality of gate drivers when a level of a signal output from at least one of the plurality of gate drivers is changed from high to low.

Figure 3:
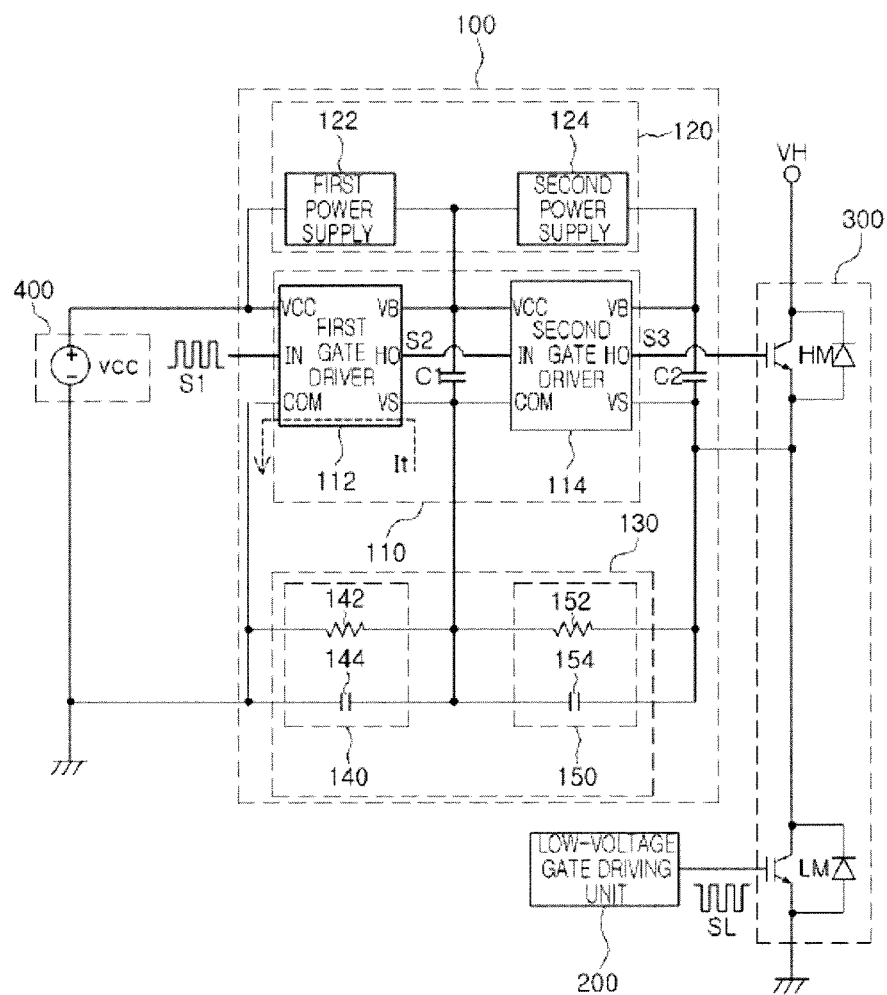
FIG. 3 is a view showing transient current occurring in a high-voltage gate driving unit in a transient state in a gate driving device according to an embodiment of the present invention.

FIG. 3 is a view showing transient current occurring in a high-voltage gate driving unit in a transient state in a gate driving device according to an embodiment of the present invention.

Referring to FIG. 3, when a level of a control signal S3 is changed from high to low, a temporary current path It may be formed between the terminal VS of the first gate driver and the terminal COM of the first gate driver.

When the balancing unit is only configured of the first resistor 142 and the second resistor 152 without the first capacitor 144 and the second capacitor 154, an imbalance in voltage division may occur between the first gate driver and the second gate driver if the current path It shown in FIG. 3 is formed. Such an imbalance in voltage division may cause voltage having a level above that of withstand voltage to be applied to the gate drivers. In this case, the gate drivers may be broken due to the voltage having a level above that of withstand voltage.

The first capacitor 144 and the second capacitor 154 may maintain the balance of the voltage between the first gate driver 112 and the second gate driver 114 even if a transient state occurs.

According to the embodiment of the invention, at the time of switching input power having a voltage level of approximately 1200V, by virtue of the first gate driver and the second gate driver, a gate driving circuit having a withstand voltage lower than 1200V may be used.

For example, instead of installing an expensive gate driving circuit having a withstand voltage of 1200 V, the voltage applied to the high-voltage gate driving unit at the time of switching is divided to be supplied to the plurality of gate drivers, such that the driving circuit is stably operable, whereby manufacturing costs may be reduced.

In addition, according to the embodiment of the invention, the first capacitor and the second capacitor may prevent voltage having a level above that of withstand voltage from being applied to the first gate driver or the second gate driver in a transient state.

Figure 4:
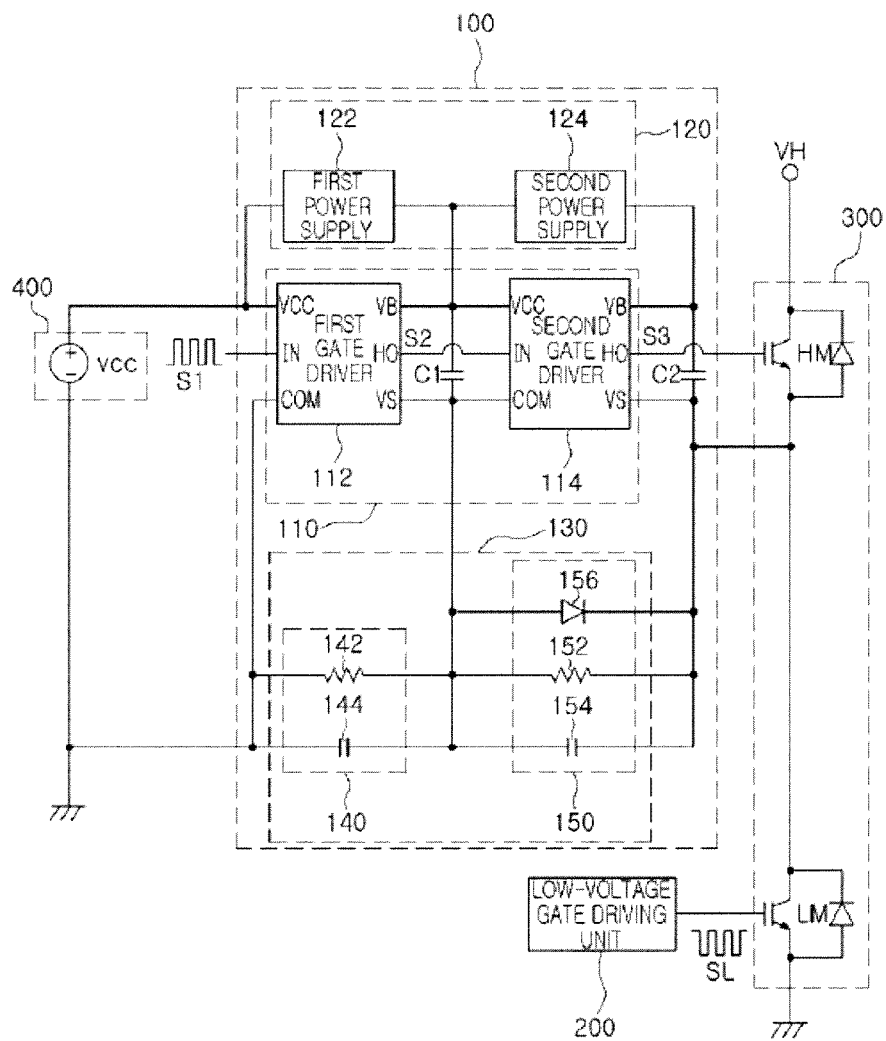
FIG. 4 is a view showing a balancing unit in a gate driving device according to another embodiment of the present invention.

FIG. 4 is a view showing a balancing unit in a gate driving device according to another embodiment of the present invention.

Referring to FIG. 4, the first balancer 140 may be composed of a resistor 142 and a capacitor 144. Further, the second balancer 150 may be composed of a resistor 152, a capacitor 154, and a diode 156.

Figure 5A:
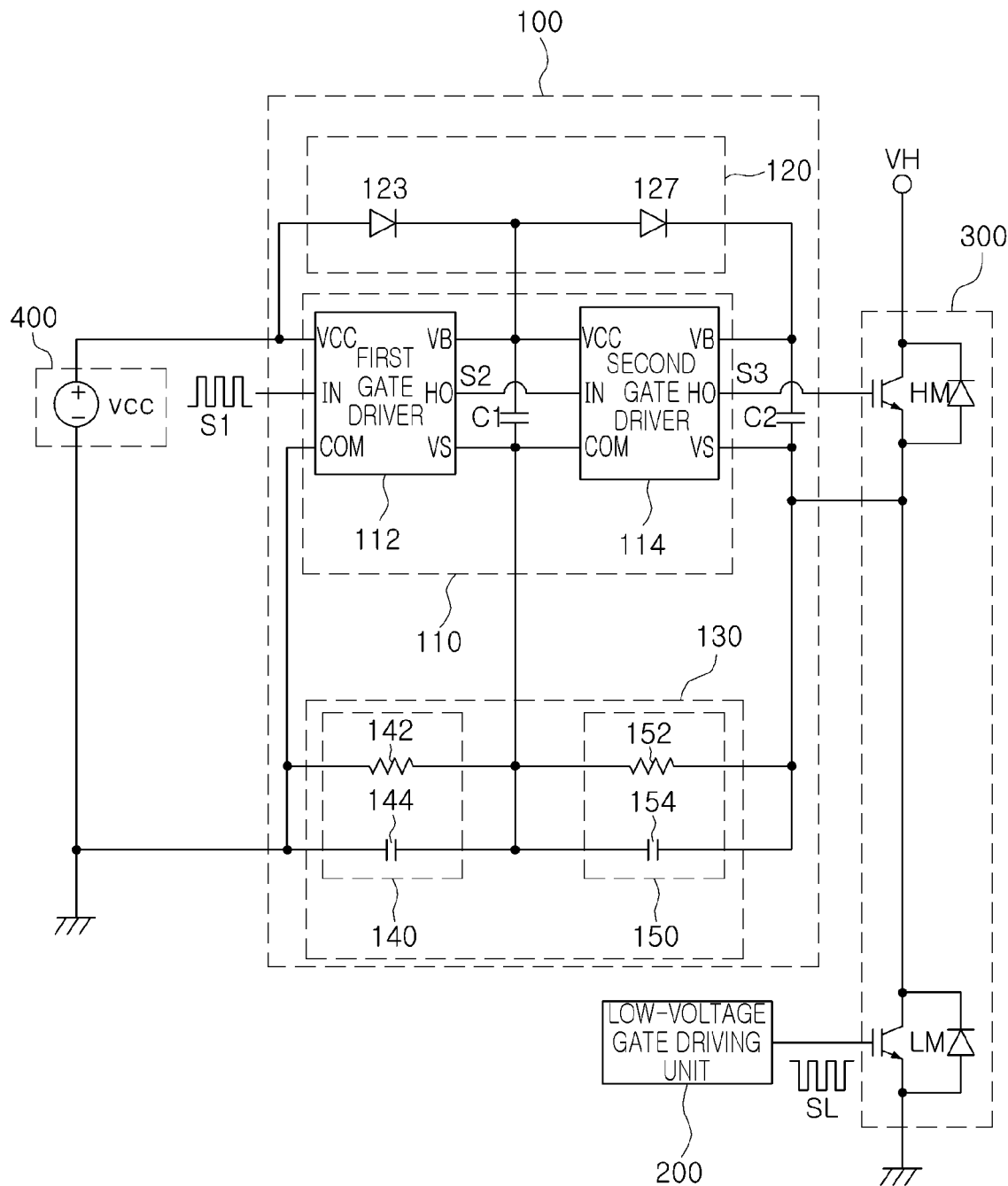
FIG. 5A is a view showing a power supply unit in a gate driving device according to an embodiment of the present invention.
Figure 5B:
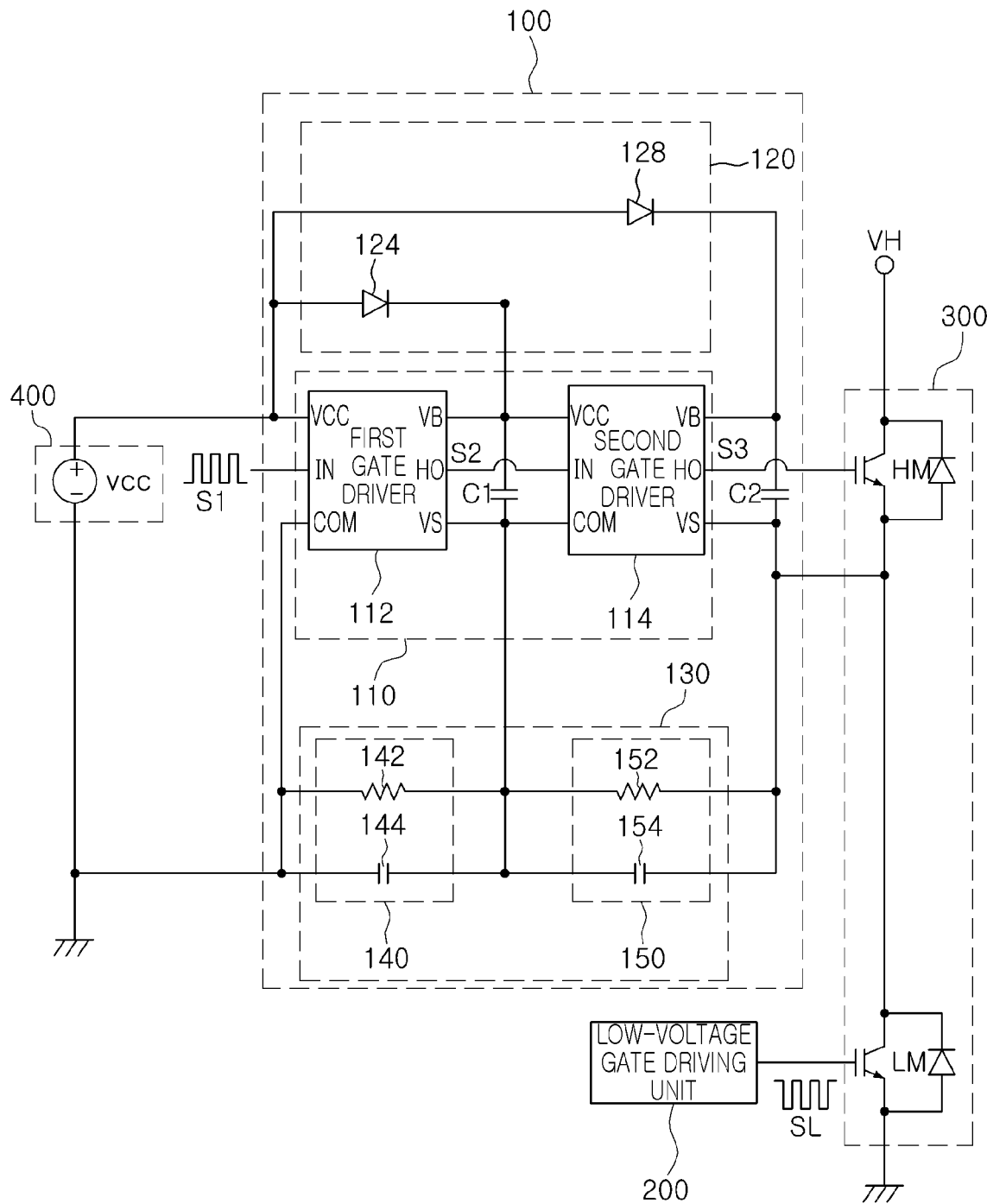
FIG. 5B is a view showing a power supply unit in a gate driving device according to another embodiment of the present invention.

FIG. 5A is a view showing a power supply unit in a gate driving device according to an embodiment of the invention; and FIG. 5B is a view showing a power supply unit in a gate driving device according to another embodiment of the invention.

Referring to FIGS. 5A and 5B, the power supply unit 120 may include a plurality of diodes.

Referring to FIG. 5A, the power supply unit 120 may include a plurality of diodes 123 and 127 connected to each other in series.

Alternatively, referring to FIG. 5B, the power supply unit 120 may include a plurality of diodes 124 and 128 connected to each other in parallel.

Since components other than the power supply unit 120 in the gate driving device shown in FIG. 5 are the same as those described above, detailed descriptions thereof will be omitted.

The power supply unit 120 may deliver single driving power vcc to gate drivers.

Further, the power supply unit 120 may form a path to charge the capacitors C1, C2 with the single driving power vcc.

Figure 6A:
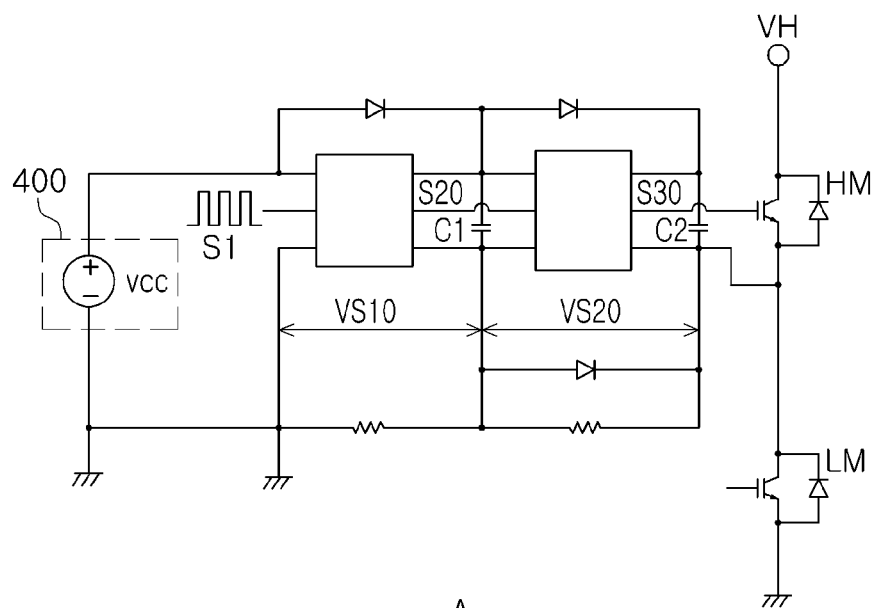
FIG. 6A is a circuit diagram of a gate driving device.
Figure 6B:
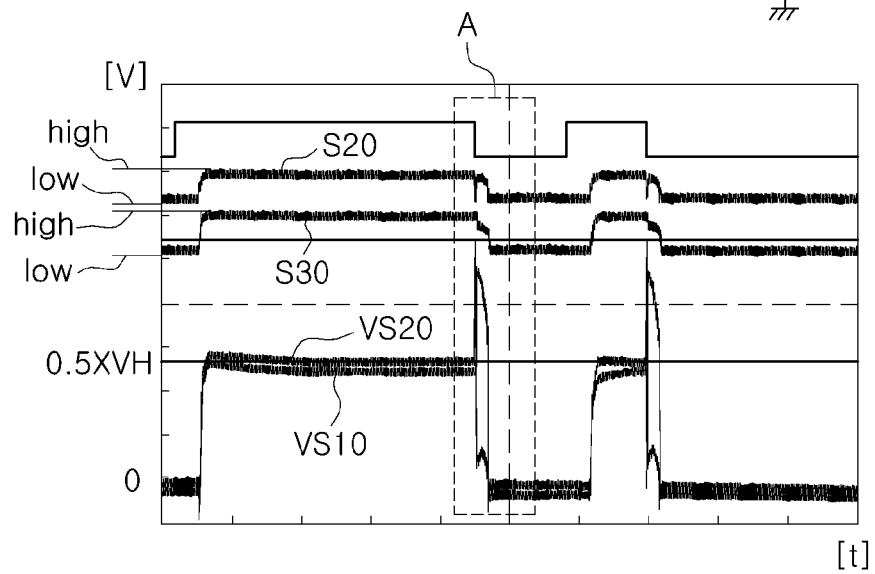
FIGS. 6B and 6C are electrical waveforms representing electrical characteristics of the gate driving device shown in FIG. 6A.
Figure 6C:
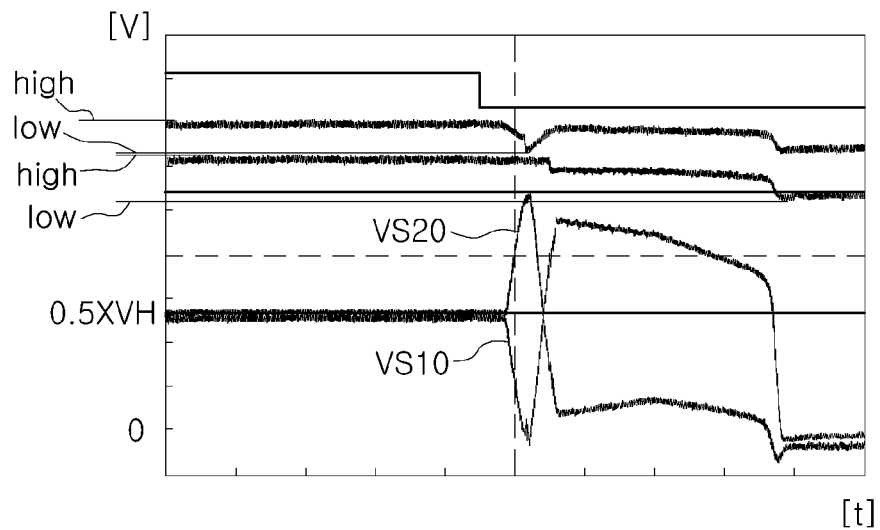

FIG. 6A is a circuit diagram of a gate driving device, and FIGS. 6B and 6C are electrical waveforms representing electrical characteristics of the gate driving device shown in FIG. 6A.

In the case of the gate driving device of FIG. 6A, the capacitors 144 and 154 provided in the gate driving device of FIG. 4 are omitted.

FIG. 6B illustrates an output signal S20 from a first gate driver, an output signal S30 from a second gate driver, a voltage V10 divided to be supplied to the first gate driver, and a voltage V20 divided to be supplied to the second gate driver.

FIG. 6C is an enlarged view of part A of FIG. 6B.

Part A represents a transient state in which the levels of the output signal S20 from the first gate driver and the output signal S30 from the second gate driver are changed from high to low.

Referring to FIGS. 6B and 6C, when the levels of the output signal S20 from the first gate driver and the output signal S30 from the second gate driver are changed from high to low, imbalance occurs between the voltage V10 divided to be supplied to the first gate driver and the voltage V20 divided to be supplied to the second gate driver.

When each of the voltage V10 divided to be supplied to the first gate driver and the voltage V20 divided to be supplied to the second gated driver has a value of 0.5×VH, the first gate driver and the second gate driver may have withstand voltage within an allowable range.

However, when the voltage VH is unequally divided to be supplied to the first gate driver and the second gate driver, voltage having a level above that of withstand voltage may be applied to the first gate driver or the second gate driver, and thus, damage may occur.

Figure 7A:
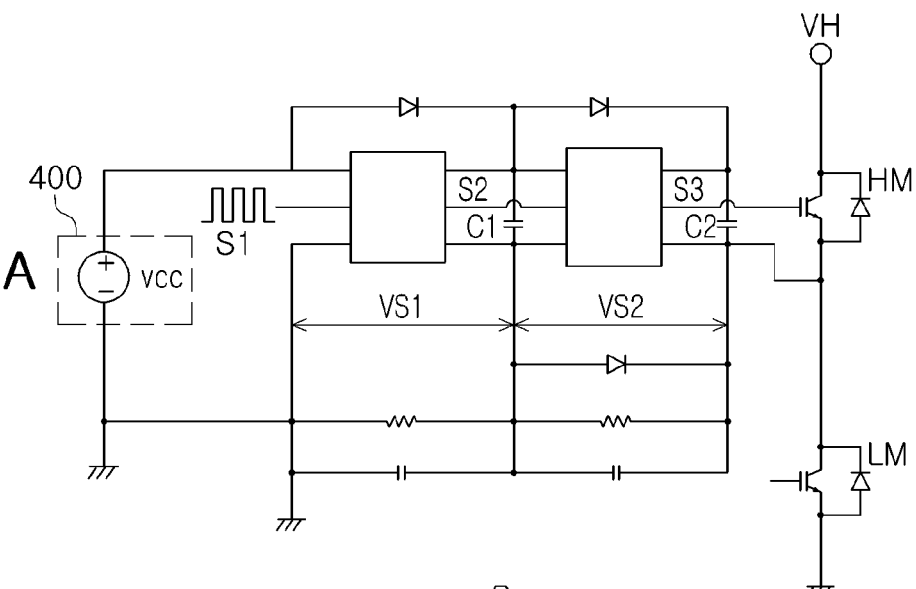
FIG. 7A is a circuit diagram of a gate driving device according to an embodiment of the present invention.
Figure 7B:
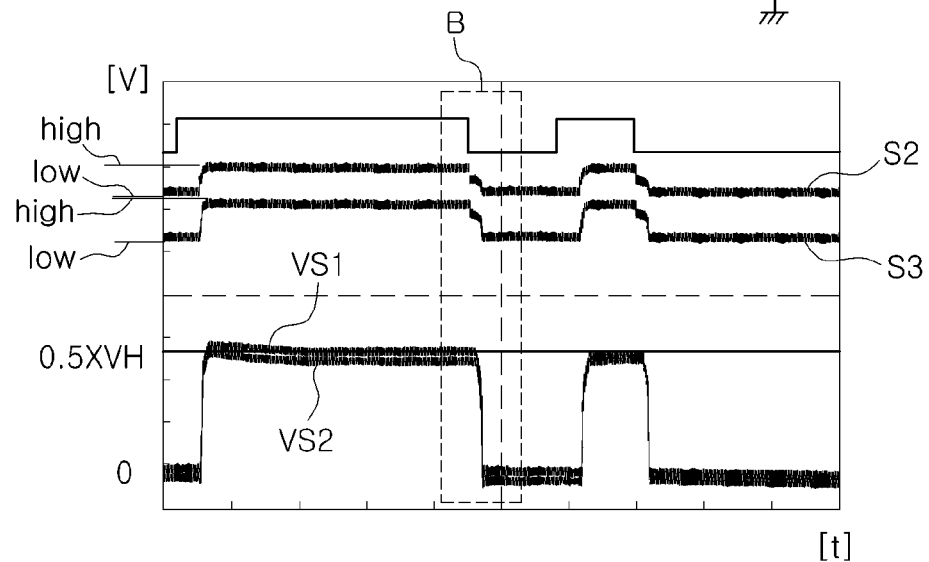
FIGS. 7B and 7C are electrical waveforms representing electrical characteristics of the gate driving device shown in FIG. 7A.
Figure 7C:
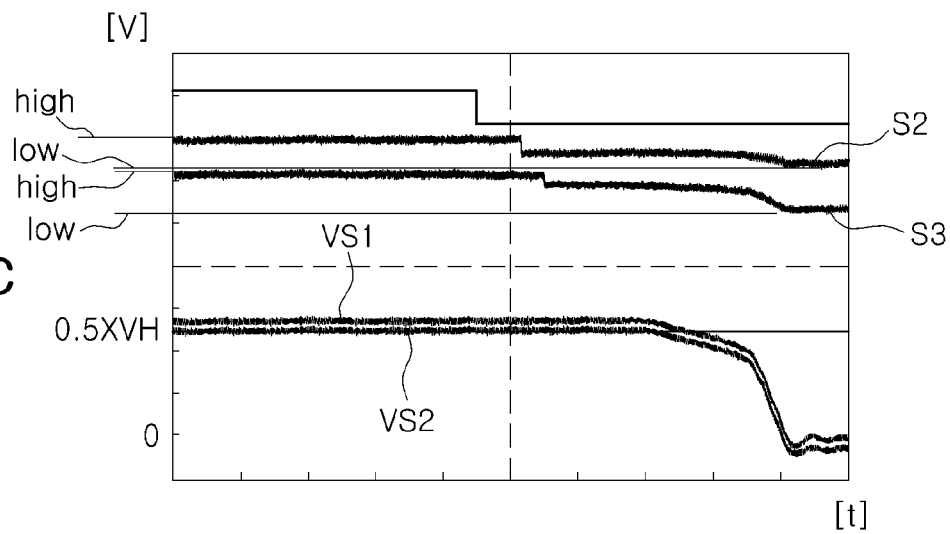

FIG. 7A is a circuit diagram of a gate driving device according to an embodiment of the present invention, and FIGS. 7B and 7C are electrical waveforms representing electrical characteristics of the gate driving device shown in FIG. 7A.

FIG. 7A is a view showing a gate driving device according to an embodiment of the present invention.

FIG. 7B illustrates an output signal S2 from the first gate driver, an output signal S3 from the second gate driver, a voltage V1 divided to be supplied to the first gate driver, and a voltage V2 divided to be supplied to the second gate driver.

FIG. 7C is an enlarged view of part B of FIG. 7B.

Part B represents a transient state in which the levels of the output signal S2 from the first gate driver and the output signal S3 from the second gate driver are changed from high to low.

Referring to FIGS. 7B and 7C and FIGS. 6B and 6C, it can be seen that in the gate driving device according to the embodiments of the invention, when the levels of the output signal S2 from the first gate driver and the output signal S3 from the second gate driver are changed from high to low, imbalance between the voltage V1 divided to be supplied to the first gate driver and the voltage V2 divided to be supplied to the second gate driver may be prevented.

In this case, a voltage level similar to that of voltage in a normal state is applied to the first gate driver and the second gate driver, even in the transient state. Therefore, the voltage V1 divided to be supplied to the first gate driver and the voltage V2 divided to be supplied to the second gated driver have levels within an allowable range of the first gate driver and the second gate driver.

Figure 8:
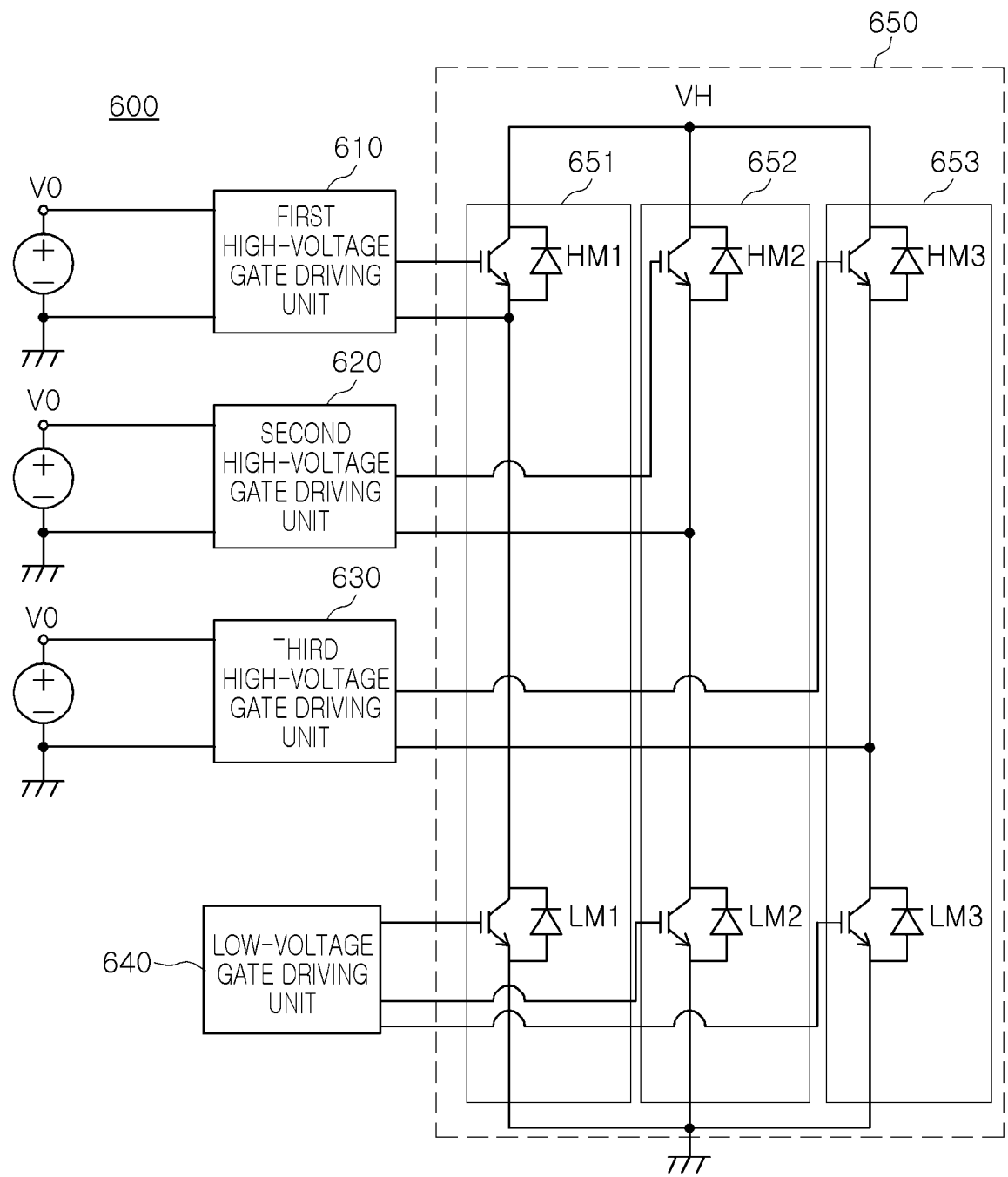
FIG. 8 shows an inverter according to an embodiment of the present invention.

FIG. 8 shows an inverter according to an embodiment of the present invention.

As described above, the inverter unit may include at least an inverter arm. If output AC power is of single-phase, a single inverter arm is included, and if output AC power is of three-phase as shown in FIG. 8, three inverter arms 651, 652 and 653 are included. The inverter according to the embodiment of the invention shown in FIG. 8 may include first to third high-voltage gate driving units 610, 620 and 630 for controlling the switching on and off of high-side switches HM1, HM2 and HM3 of the three inverter arms 651, 652 and 653. In addition, the switching on and off of low-side switches LM1, LM2 and LM3 may be controlled by a low-voltage gate driving unit 640. Since the configuration of the first to third high-voltage gate driving units 610, 620 and 630 may be identical to the configuration of the high-voltage gate driving unit 100 shown in FIG. 1, the detailed description thereof is omitted.

As set forth above, according to embodiments of the invention, a gate driving device stably operable at high voltage, and an inverter having the same can be provided.

Further, according to embodiments of the present invention, a gate driving device capable of preventing voltage having a level above that of withstand voltage in a transient state, and an inverter having the same can be provided.

While the present invention has been shown and described in connection with the embodiments, it will be apparent to those skilled in the art that modifications and variations can be made without departing from the spirit and scope of the invention as defined by the appended claims.

What is claimed is:

1. A gate driving device, comprising:
   an inverter arm including a high-side switch and a low-side switch;
   a gate driving unit receiving an instruction signal to provide switching control to the inverter aim, outputting a control signal to control switching of the inverter arm, and including a plurality of gate drivers; and
   a balancing unit equally dividing a voltage output from a node between the high-side switch and the low-side switch into a plurality of voltages and supplying the plurality of voltages to respective gate drivers among the plurality of gate drivers, according to the switching of the inverter arm based on the control signal.

2. The gate driving device of claim 1, wherein the balancing unit includes a plurality of balancers connected to the plurality of gate drivers, respectively, and causing the voltage applied to the plurality of gate drivers to be equally divided to be supplied to the respective gate drivers.

3. The gate driving device of claim 2, wherein the plurality of balancers include a plurality of resistors respectively connected to the plurality of gate drivers in parallel.

4. The gate driving device of claim 3, wherein the plurality of balancers include a plurality of capacitors respectively connected to the plurality of resistors in parallel.

5. The gate driving device of claim 1, wherein the balancing unit maintains a state of voltage divided to be supplied to the respective gate drivers when a level of a signal output from any one of the plurality of gate drivers is changed from high to low.

6. The gate driving device of claim 1, further comprising a driving power supply unit supplying driving power to the gate driving unit.

7. The gate driving device of claim 6, further comprising a power supply unit delivering the driving power to the plurality of gate drivers.

8. The gate driving device of claim 7, wherein the power supply unit includes a plurality of diodes connected to one another in series.

9. The gate driving device of claim 7, wherein the power supply unit includes a plurality of diodes connected to one another in parallel.

10. An inverter comprising:
an inverter unit having an inverter arm and switching input power to output alternating current (AC) power, the inverter arm including a high-side switch and a low-side switch connected to each other in series between an input power terminal supplying the input power having a predetermined voltage level and a ground;
a gate driving unit having a plurality of gate drivers to control switching of the high-side switch, the gate drivers being disposed between an input terminal receiving an instruction signal to provide switching control to the inverter unit and an output terminal outputting a control signal to control switching of the inverter unit; and
a balancing unit equally dividing a voltage output from a node between the high-side switch and the low-side switch into a plurality of voltages and supplying the plurality of voltages to respective gate drivers among the plurality of gate drivers according to the switching of the high-side switch, and maintaining a state of voltage divided to be supplied to the respective gate drivers.

11. The inverter of claim 10, wherein the balancing unit includes a plurality of balancers connected to the plurality of gate drivers, respectively, and causing the voltage applied to the plurality of gate drivers to be equally divided to be supplied to the respective gate drivers.

12. The inverter of claim 11, wherein the plurality of balancers include a plurality of resistors respectively connected to the plurality of gate drivers in parallel.

13. The inverter of claim 12, wherein the plurality of balancers include a plurality of capacitors respectively connected to the plurality of resistors in parallel.

\* \* \* \* \*